(12) United States Patent
Dang et al.

(10) Patent No.: US 8,689,437 B2
(45) Date of Patent: Apr. 8, 2014

(54) METHOD FOR FORMING INTEGRATED CIRCUIT ASSEMBLY

(75) Inventors: Bing Dang, Chappaqua, NY (US); David Hirsch Danovitch, Granby (CA); Mario John Interrante, New Paltz, NY (US); John Ulrich Knickerbocker, Monroe, NY (US); Michael Jay Shapiro, Austin, NY (US); Van Thanh Truong, Brossard (CA)

(73) Assignee: International Business Machines Corporation, Armonk, NY (US)

( * ) Notice: Subject to any disclaimer, the term of this patent is extended or adjusted under 35 U.S.C. 154(b) by 912 days.

(21) Appl. No.: 12/490,804

(22) Filed: Jun. 24, 2009

(65) Prior Publication Data

US 2010/0326702 A1     Dec. 30, 2010

(51) Int. Cl.
*H01R 9/00* (2006.01)
*H05K 3/00* (2006.01)

(52) U.S. Cl.
USPC ............... 29/842; 29/825; 29/829; 29/846; 29/874

(58) Field of Classification Search
USPC ............ 29/842, 825, 829, 843, 846, 874; 257/690, 692, 698, 701, 734, 737, 738, 257/E21.503, E21.511, E23.027; 438/106, 438/107, 109, 110, 127, 458
See application file for complete search history.

(56) References Cited

U.S. PATENT DOCUMENTS

| | | | |
|---|---|---|---|
| 5,916,460 A | 6/1999 | Imoto et al. | |
| 6,413,851 B1 * | 7/2002 | Chow et al. | 438/613 |
| 6,521,530 B2 | 2/2003 | Peters et al. | |
| 6,610,559 B2 * | 8/2003 | Wang et al. | 438/108 |
| 6,774,492 B2 * | 8/2004 | Ahn et al. | 257/774 |
| 6,774,493 B2 | 8/2004 | Capote et al. | |
| 7,034,401 B2 | 4/2006 | Savastiouk et al. | |
| 7,186,586 B2 | 3/2007 | Savastiouk et al. | |
| 7,225,538 B2 | 6/2007 | Eldridge et al. | |
| 7,241,641 B2 | 7/2007 | Savastiouk et al. | |
| 7,291,543 B2 | 11/2007 | Grigg et al. | |
| 7,317,256 B2 | 1/2008 | Williams et al. | |
| 7,800,225 B2 * | 9/2010 | Choi | 257/737 |
| 7,863,092 B1 * | 1/2011 | Chaware et al. | 438/106 |
| 2005/0189636 A1 | 9/2005 | Savastiouk et al. | |
| 2007/0173034 A1 | 7/2007 | Tsurume et al. | |
| 2008/0032457 A1 | 2/2008 | McWilliams et al. | |
| 2008/0079150 A1 | 4/2008 | Simon et al. | |
| 2008/0113457 A1 | 5/2008 | Tsay et al. | |

OTHER PUBLICATIONS

Search Report for PCT/US2010/039330 dated Aug. 17, 2010.

* cited by examiner

*Primary Examiner* — Thiem Phan
(74) *Attorney, Agent, or Firm* — Daniel P. Morris; Ryan, Mason & Lewis, LLP (57) ABSTRACT

A method for forming an integrated circuit assembly comprises forming first solder bumps on a first die, and forming a first structure comprising the first die, the first solder bumps, a first flux, and a first substratum. The first die is placed upon the first substratum. The first solder bumps are between the first die and the first substratum. The first flux holds the first die substantially flat and onto the first substratum.

20 Claims, 9 Drawing Sheets

FIG. 2
WAFER BUMPING AND TEST
200

FIG. 3
WAFER DICING
300

FIG. 4
LAMINATING ON A SECOND SUBSTRATE WITH FLUX
400

FIG. 5
LASER ABLATION
500

FIG. 6
GLASS WAFER REMOVED
600

FIG. 7
ASHING
700

FIG. 8
OPTIONAL TEST, RETEST, REPLACE OR REMOVE DIE
800

FIG. 9
OPTIONAL PICK AND PLACE
900

FIG. 10A
STACK ABOVE SECOND SUBSTRATE: ALIGN,
PLACE AND JOIN WAFER TO DIE; DICE LATER
1000A

FIG. 10B
DICE
1000B

FIG. 14
DIE PLACE AND REFLOW
1400

METHOD FOR FORMING INTEGRATED CIRCUIT ASSEMBLY

This invention was made with Government support under Contract No.: H98230-07-C-0409 awarded by the National Security Agency. The Government has certain rights in this invention.

FIELD OF THE INVENTION

The present invention relates generally to packaging and assembly of integrated circuits and interposers. More particularly the invention relates to integrated circuit and interposer assembly of thinned die with through silicon vias.

BACKGROUND OF THE INVENTION

Three-dimensional (3D) integrated circuits (ICs), which contain multiple layers of active devices, have the potential to dramatically enhance IC performance, functionality, and packing density. 3D ICs can comprise multiple dies stacked one on top of another with required between-die interconnects. A known method of between-die interconnect is wiring that originates on one die, goes around the edges of the one die, and terminates on another die. 3D ICs may facilitate the integration of heterogeneous materials, devices, and signals. Before these advantages can be realized, the processes required to build ICs with multiple layers must be efficient, cost effective, compatible with current state-of-the-art silicon processing technology, and highly manufacturable, that is, provide highly reliable product with good manufacture yield. Furthermore, there are advantages to smaller dimensions of between-die interconnects, as well as closer spaced die pads and between-die interconnect. The smaller dimensions and smaller spaces provide faster circuits containing multiple die, and provide smaller, and therefore, less costly, packaging. Smaller packaging enables devices or systems comprising the smaller package to be smaller and less costly to manufacture.

SUMMARY OF THE INVENTION

Principles of the invention provide, for example, methods and apparatus for forming an integrated circuit assembly. The integrated circuit assembly comprises, for example, through silicon vias, and thinned dies diced from thinned wafers. The integrated circuit assembly is formed by, for example, using flux to hold thinned dies flat.

For example, in accordance with one aspect of the invention, a method for forming an integrated circuit assembly is provided. The method for forming the integrated circuit assembly comprises forming first solder bumps on a first die, and forming a first structure comprising the first die, the first solder bumps, first flux, and a first substratum. The first die is placed upon the first substratum. The first solder bumps are between the first die and the first substratum. The first flux holds the first die substantially flat and onto the first substratum.

In accordance with another aspect of the invention, an integrated circuit assembly is provided. The integrated circuit assembly comprises a first die. The integrated circuit assembly is formed by forming solder bumps on the die, and forming a structure comprising the die, the solder bumps, flux, and a substratum. The die is placed upon the substratum. The solder bumps are between the die and the substratum. The flux holds the die substantially flat and onto the substratum.

An advantage of the invention is, for example, three-dimensional integrated circuit (3DIC) assemblies which provide area savings, and therefore cost savings, on boards or other devices on which the 3DICs assemblies are mounted. An additional advantage of the invention is, for example, lower height 3DIC assemblies due to thinned wafers, low-height solder bumps, and through silicon vias. The method for forming the integrated circuit assembly provides, for example, cost effective handling of thinned wafers and dies without damaging the thinned wafers and thinned dies. Methods of the invention provide cost effective integrated circuit assemblies.

These and other features, objects and advantages of the present invention will become apparent from the following detailed description of illustrative embodiments thereof, which is to be read in connection with the accompanying drawings.

DETAILED DESCRIPTION OF THE INVENTION

A boat, as used herein, is a device designed to hold a semiconductor wafer during processing, for example, thermal processing. A boat is made of, for example, a high purity, and temperature resistant material such as fused silica, quartz, polycrystalline silicon, or silicon carbide.

An interposer is an intermediate layer often used for electrical interconnection routing or as a ground/power plane. The purpose of an interposer is, for example, to spread a connection to a wider pitch, to reroute a connection, or to modify a connection. An interposer is, for example, a die.

Ashing is the process of removing residue from a wafer or die. In an embodiment of the invention ashing removes residue of a bonding layer. Ashing may be performed, for example, by methods of plasma ashing. Using a plasma source, a monatomic reactive species is generated. For example, oxygen and fluorine are common reactive species. The reactive species combines with the residue to form ash which is removed, for example, with a vacuum pump. Ashing is typically performed within an ashing chamber. Ashing may be performed using heat.

A three-dimensional (3D) package contains two or more die or chips (integrated circuits) stacked vertically so that they occupy less space than if placed side-by-side. In some 3D packages, the stacked dies are wired together along their edges. This edge wiring slightly increases the length and width of the package and usually requires an extra interposer layer between the dies. More recently, in some 3D packages, through-silicon-vias replace edge wiring by creating vertical connections through the body of the dies, and thus not requiring additional package length or width. An interposer is typically not required. Because an interposer is not required, a through-silicon-via (TSV) 3D package can be lower in height than an edge-wired 3D package. The TSV technique is sometimes also referred to as TSS (through-silicon stacking). Examples of 3D packages are system in package (SIP) and multi-chip module (MCM).

A through-silicon-via (TSV) is a vertical electrical connection passing completely through a silicon wafer or die. TSV technology is important in creating three-dimensional (3D) packages and 3D integrated circuits.

The need for faster between-die interconnect within 3D ICs is addressed by TSVs, thus eliminating the need for between-die interconnect that comprises wiring that originates on one die, goes around the edges of the one die, and terminates on another die. TSVs are shorter, have less electrical parasitics, enable faster 3D ICs, and enable a smaller package.

Faster packaged integrated circuits, 3D and otherwise, are enabled by shorter TSVs. Thinner wafers provide shorter TSVs, and are therefore desirable. However, thinned wafers are more difficult to handle and process because they are more fragile and more prone to breakage, cracking and warpage. The present invention provides methods for handling and packaging thinned wafers without damage.

Faster operation of packaged integrated circuits, 3D and otherwise, is also enabled by closer die vertical spacing provided by lower height solder bumps, termed low-height solder bumps. Embodiments of the invention have solder bumps that range from approximately 4 µm to approximately 100 µm in height.

An advantage of the present invention is, for example, a process for joining wafers, joining dies, forming die stacks, and connecting the joined wafers, joined dies, and diestacks to package substrates or packages, wherein the process requires only one reflow step.

Aspects of the present invention are, for example, thinned die comprising TSVs, using flux to hold the thinned die flat, allowing die pre-test and die replacement within an economical wafer oriented process, a process for handling thinned die without damaging the thinned die, a process that applies no or a relatively low force to thinned wafers and dies, a process that is applicable to ceramic, organic and silicon based packages, and enabling the formation of units comprising thinned die and/or wafers which may be inverted and/or tested. Other aspects of the invention are, for example, allowing for pick-and-place of die using a tool, for example, a vacuum tool, and the use of under-filled or injection molded adhesive for structural integrity. Aspects of invention provide solder bumps and pads with a center-to-center pitch of less than, for example, 50 µm, and as low as, for example, 5 µm. Aspects of invention further provide thinned die less than, for example, 100 µm, or even 10 µm, thick. The thinned dies comprise TSVs.

Embodiments of the invention have: an option to use dicing tape to hold thinned dies or thinned wafers, with TSVs, flat until they are placed onto a substrate, die stack or assembly; an option to use die or wafer stack structure as a sub-unit or sub-assembly that is tested before final assembly into the unit or assembly; and option to use force or weight to maintain die and/or wafer flatness during joining, and to support die and/or wafers during joining, and an option for using a vacuum holder or alternate adhesive to hold thinned dies, wafers, and substrates flat during pick-and-place, alignment and stacking.

The invention provides the option to hierarchically form units form sub-units. The sub-units are formed according to a method of the invention. Both the sub-units and units comprise one or more of thinned die, thinned wafers, substrates, and packages. In an embodiment of the invention, sub-units are formed with a sub-unit reflow, and units are formed with a separate unit reflow at a lower temperature than the sub-unit reflow.

An aspect of the invention is the holding of a die or wafer, for example, a thinned die or a thinned wafer, flat while handling or processing prior to permanent bonding into a module or die stack for product application. Holding the die flat is achieved, for example, by using flux, a temporary adhesive such as dicing tape, a vacuum chuck or head, or alternate means. Normally, flux is used to aide wetting of solder to pads. Flux may be normally also used by employing the tacky nature of the flux to keep die in X-Y position for joining. However, the present invention also uses the flux to maintain die and/or wafer flatness and/or planarity. Similarly, a dicing tape is normally used to hold die in X-Y position during dicing of wafer into dies. However, the present invention also uses the dicing tape to maintain die and/or wafer flatness and/or planarity. Likewise a vacuum chuck is normally used to hold die for pick and place, and to position for joining. However, the present invention uses a vacuum chuck to hold the die or wafer flat. Inherent stresses within thinned dies and wafers would otherwise lead to non-planarity and warping.

Figure 1:
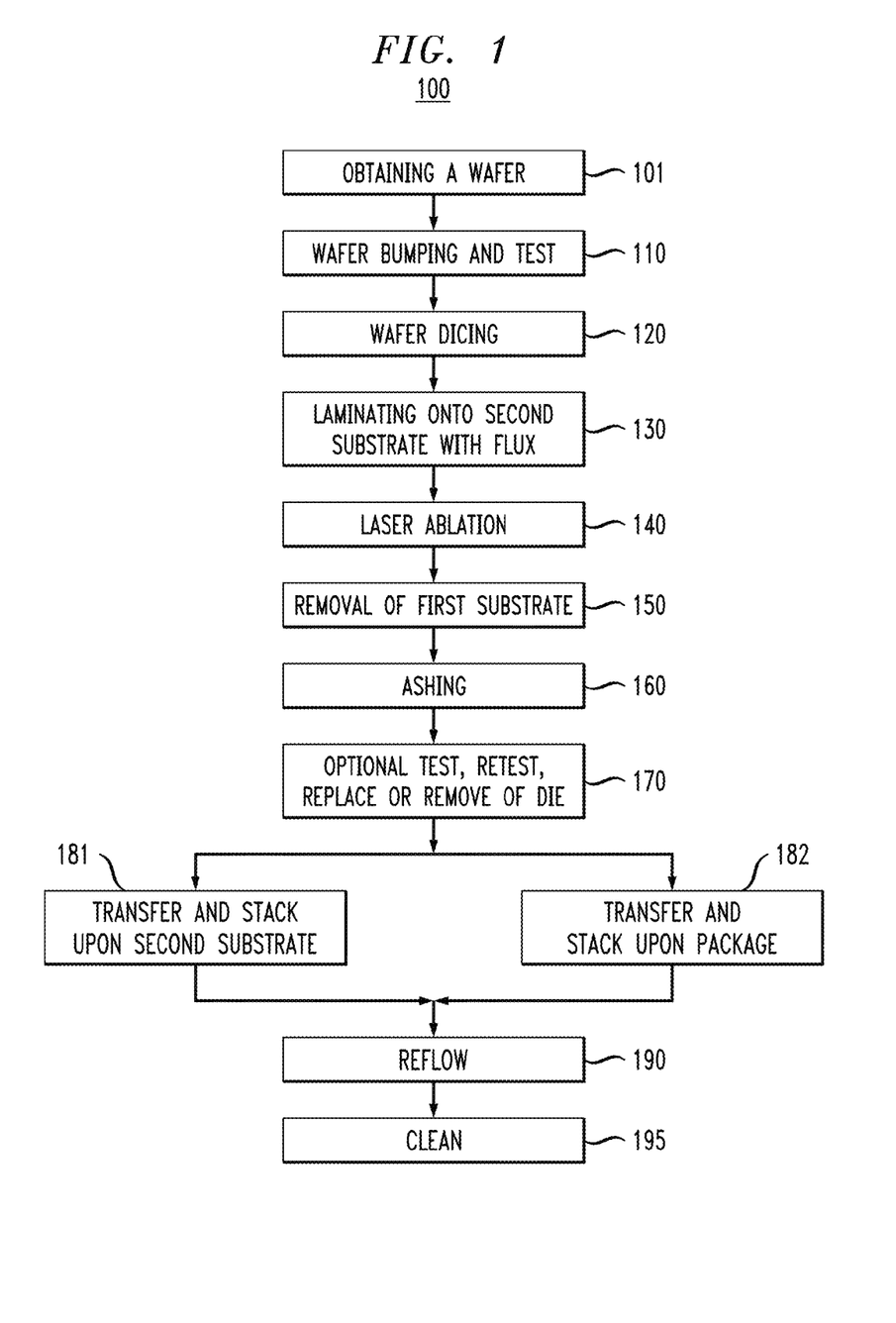
FIG. 1 illustrates a flow diagram for forming an integrated circuit assembly according to an exemplary embodiment of the invention.

FIG. 1 illustrates a flow diagram 100 of the process according to an embodiment of the invention. FIGS. 2 through 14 illustrate various steps within the process 100 according to embodiments of the invention.

The first step 101 of the process 100 is obtaining an integrated circuit wafer. The wafer is formed, for example, by using methods known in the art. For example, the wafer is a semiconductor wafer, such as a silicon semiconductor wafer, comprising active electronic circuits. For another example, the wafer is a wafer comprising conductive routing traces. The wafer comprises at least one die; however, typically the wafer comprises many dies, for example, from ten to one-thousand die. A die typically comprises electrical routing in the form of metal runners and pads. A die may further optionally comprise electronic circuitry comprising at least one of active devices for example, transistors and diodes. The electronic circuitry may also comprise other devices such as resistors, capacitors or inductors. A die is, for example, an integrated circuit (IC) chip or an interposer.

Figure 2:
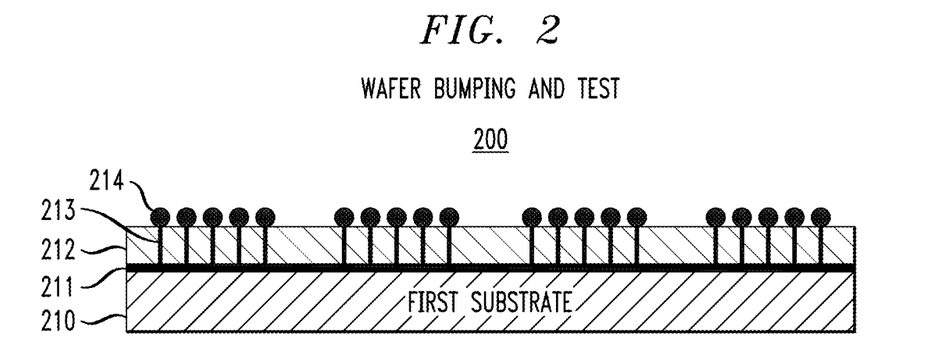
FIG. 2 illustrates a mounted wafer after solder bumping and optional testing according to an exemplary embodiment of the invention.

Prior to final wafer formation, the wafer is, for example, a relatively thick wafer, typically 700 μm to 900 μm thick, and typically 200 mm to 300 mm in diameter. The relatively thick wafer is thinned to, for example, less than 100 μm thick. Wafers are thinned while bonded to a substrate for support, for example, a first substrate 210 by a bonding layer 211 (FIG. 2). The first substrate comprises, for example glass or silicon. The wafer is typically sub-divided into a plurality of dies. The dies may be substantially identical or comprise different circuits or components. The dies may be, for example, a memory circuit, a processor, an application specific integrated circuit (ASIC) die, a field programmable gate array (FPGA), a digital circuit, a logic circuit or an analog circuit.

The second step 110 of the process 100 is wafer bumping and test. Solder bumps are formed on the wafer using methods known in the art, for examples, a method using injection molded solder, and a method using plated solder and photoresist. Solder bumps are formed on metal first pads formed within or upon the wafer. The solder bumps are, preferably, 10 μm to 25 μm in diameter and 4 μm to 12 μm in height above the surface of the wafer. In the present invention, relatively short solder bumps, 4 μm to 12 μm high, have advantage over taller solder bumps, for example, by allowing dies, chips and/or interposers to be stacked closer together, thus lower the cost of multi-chip arrangements, and reducing electrical signal delays. Typical center-to-center spacing of the solder bumps is, for example, 20 μm to 50 μm.

Testing the dies on the wafer is optional. Testing may be done by methods known in the art. For example, dies may be tested before the wafer is thinned producing known-good-dies (KGDs). For a second example, dies on the wafer may be tested using built-in-self-test (BIST). For a third example, dies on the wafer may be tested by probing, preferably using fine-pitch probes to match the pitch of the solder bumps. Testing may be performed before or after wafer thinning, and before or after solder bump formation.

FIG. 2 shows the mounted wafer 200 after bumping and test. The mounted wafer comprises wafer 212, a first substrate 210, a bonding layer 211, TSVs 213 and solder bumps 214. The wafer 212 is typically a semiconductor wafer, for example, a silicon wafer, and comprises metal conductors and, optionally, electrical circuits (not shown). Wafer 212 has TSVs 213 going through the wafer. TSVs 213 comprise conductive material so that they form a conductor through the wafer. The conductive material is, for example, a metal. The purpose of a TSV is to be a conduction path through the wafer. The formation of TSVs 213 is known in the art. In order to make contact to the solder bumps on the front side of the wafer, TSVs are usually terminated, on the front side of the wafer, on a first pad. In order to make contact to the backend of a TSV, that is, the end of the TSV on the backside of the wafer, that is, the side of the wafer opposite the front side of the wafer, the TSV is coupled to a second pad. Thus the TSV is coupled to a first pad on the front side of the wafer, and a second pad on the backside of the wafer. Solder bumps 214 are formed on the surface of the wafer 212. The bonding layer 211 adheres the wafer 212 to the first substrate 210. The bonding layer 211 comprises, for example, a polymer adhesive or dicing tape, that is, a double-sided adhesive tape. The wafer 212 is thinned after it is bonded to the first substrate 210 with bonding layer 211, ensuring support for the thin wafer to avoid wafer cracking and wafer warping.

Figure 3:
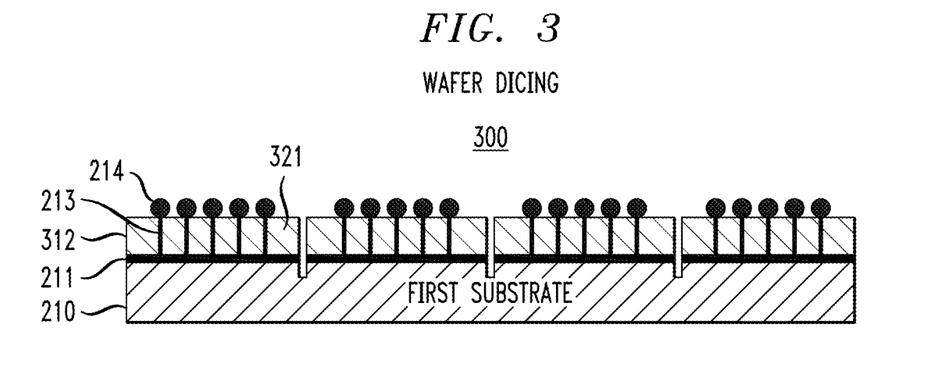
FIG. 3 illustrates a wafer diced into individual dies according to an exemplary embodiment of the invention.

The third step 120 is wafer dicing. The individual dies within the wafer 212 are separated by dicing. The wafer 212 is diced by methods of, for example, saw dicing or laser dicing. Methods of wafer dicing are known in the art. FIG. 3 shows the diced wafer 312 formed form dicing wafer 212 into individual dies 321. Although the diced wafer 312 typically comprises many dies, only four die 321 are illustrated in FIG. 3

Figure 4:
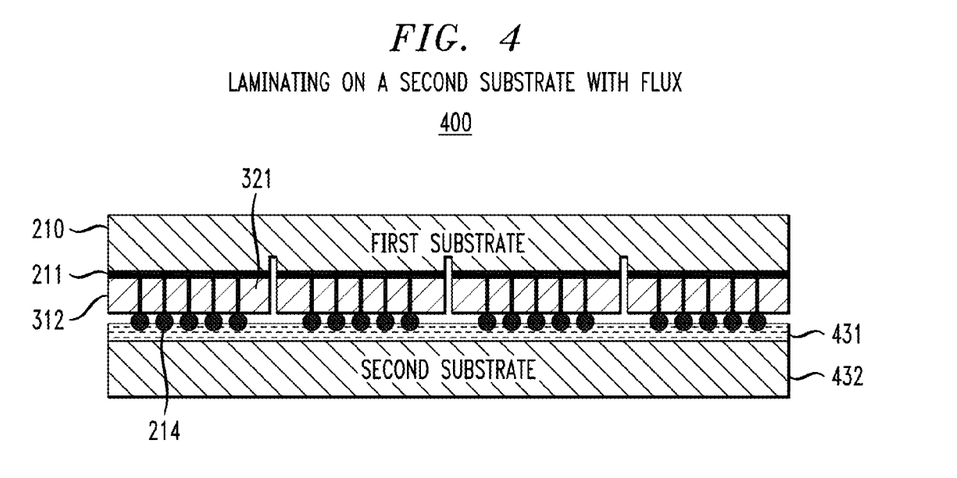
FIG. 4 illustrates a mounted diced wafer laminated onto a second substrate according to an exemplary embodiment of the invention.

The fourth step 130 is laminating the diced wafer 312 onto a second substrate with flux. The diced wafer 312 is laminated or mounted onto a second substrate 432. As shown in FIG. 4, the diced wafer 312 is laminated onto the second substrate 432 such that the solder bumps 214 faces the second substrate 432. The diced wafer 312 is laminated using flux 431 between the diced wafer 312 and the second substrate 432. The flux 431 serves at least two purposes. The flux 431 holds the thinned diced wafer 312, including the thinned individual dies 321, onto the second substrate 432 and assists in maintaining the individual dies 321 to be flat. The flux 431 also enhances bonding of the solder bumps, for example, to the first pads and to second pads. The bonding of the solder bumps will be described in one of the following steps. The flux 431 is typically tacky, so that it will hold the diced wafer 312 to the second substrate 432. There are a number of fluxes available, for example, a no-clean flux, which will leave substantially no residue after the subsequent step of reflow 190. An example of a no-clean flux is known as alpha flux. A second example of an available flux is a no-flow flux. The no-flow flux additionally acts as an underfill, at least partially filling voids after reflow 190. A third example of an available flux is a clean-required flux that typically requires cleaning of flux residue after reflow 190. The second substrate 432 will support the individual die 321 after the first substrate is removed in the sixth step 150. The second substrate 432 is, for example, a glass, silicon, another semiconductor, or a boat. The second substrate, optionally, has pads for bonding to solder bumps 214. Optionally dicing tape or a vacuum holder may be employed to hold the thinned diced wafer 312 flat. However, flux is applied prior to reflow to enhance bonding of solder bumps.

Figure 5:
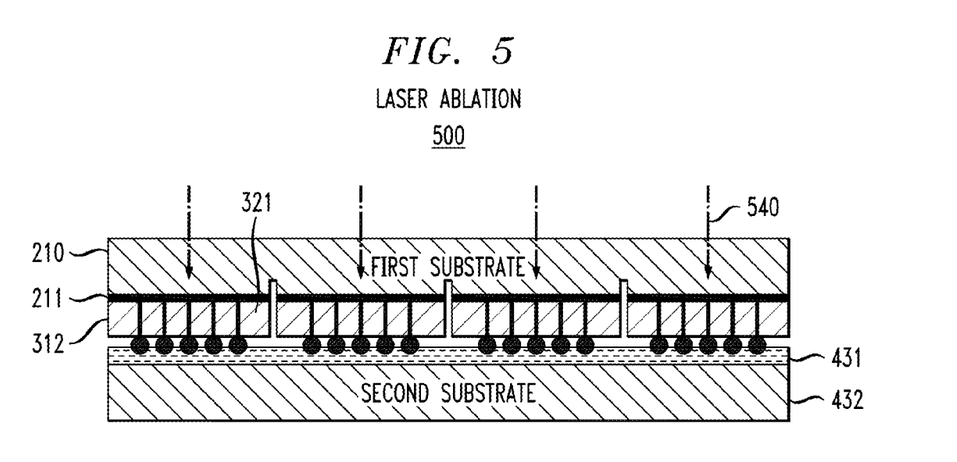
FIG. 5 illustrates the diced wafer, including individual dies, undergoing ablation according to an exemplary embodiment of the invention.

The fifth step 140 is laser ablation. Laser ablation releases the bonding between the first substrate 210 and the diced wafer 312, including the individual dies 321. It renders the bonding layer 211 substantially unable to continue bonding between the first substrate 210 and the diced wafer 312. Laser ablation is performed with, for example, a 308 nm wavelength laser. FIG. 5 illustrates the diced wafer 312 undergoing ablation. The laser radiation incident upon the diced wafer 312 is indicated by dashed lines 540.

Figure 6:
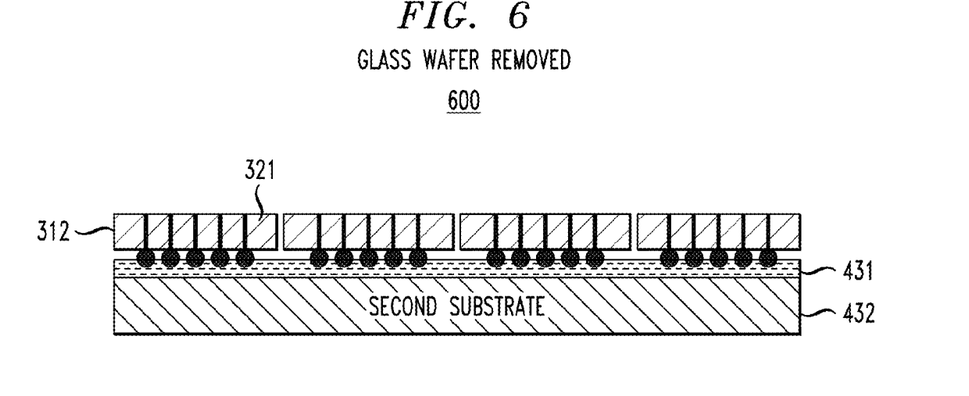
FIG. 6 illustrates the diced wafer, including individual dies, after removal of the first substrate according to an exemplary embodiment of the invention.

The sixth step 150 is removal of the first substrate 210. The first substrate 210 is removed from the diced wafer 312 laminated onto the second substrate 432. The first substrate has fulfilled it function of, for example, supporting and holding flat the wafer 212 and subsequently diced wafer 312 while undergoing processing, for example, the steps 101 through 140. FIG. 6 illustrates the diced wafer 312, including individual dies 321, after removal of the first substrate 210. The diced wafer 312, including individual dies 321, remains laminated upon the second substrate 432 with flux 431.

Figure 7:
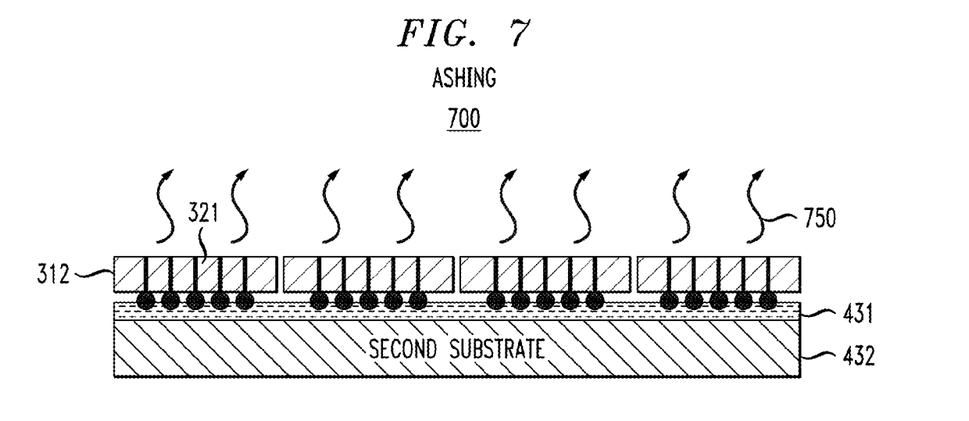
FIG. 7 illustrates the diced wafer, including individual dies, undergoing ashing according to an exemplary embodiment of the invention.

The seventh step 160 is ashing. Ashing is performed to remove residue from the bonding layer 211. The residue was formed from or is the remains of bonding layer 211 after removal of the first substrate in the sixth step 150. Ashing may be performed with a plasma and/or heat. FIG. 7 illustrates the diced wafer 312, including individual dies 321, laminated onto the second substrate 432 with flux 431, undergoing ashing. Lines 750 indicate the removal of residue or remains of bonding layer 211.

Figure 8:
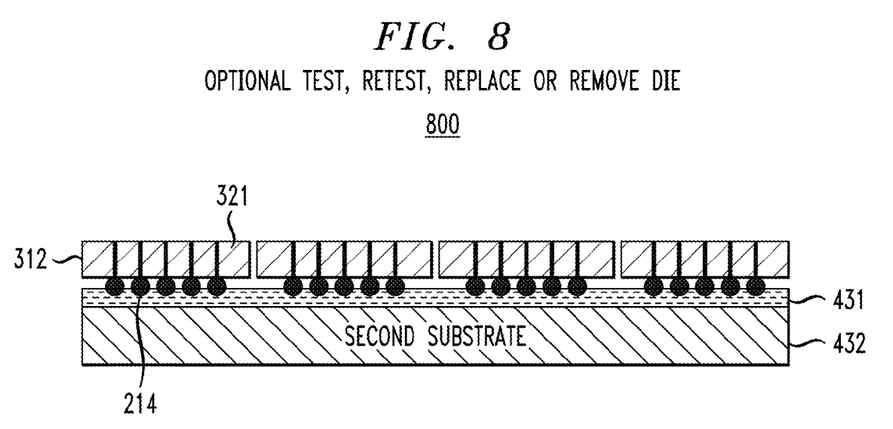
FIG. 8 illustrates the first structure comprising the diced wafer with solder bumps, including individual dies, after optional test, retest, replacement of die, removal of die, or, if no options are performed, after ashing according to an exemplary embodiment of the invention.
Figure 9:
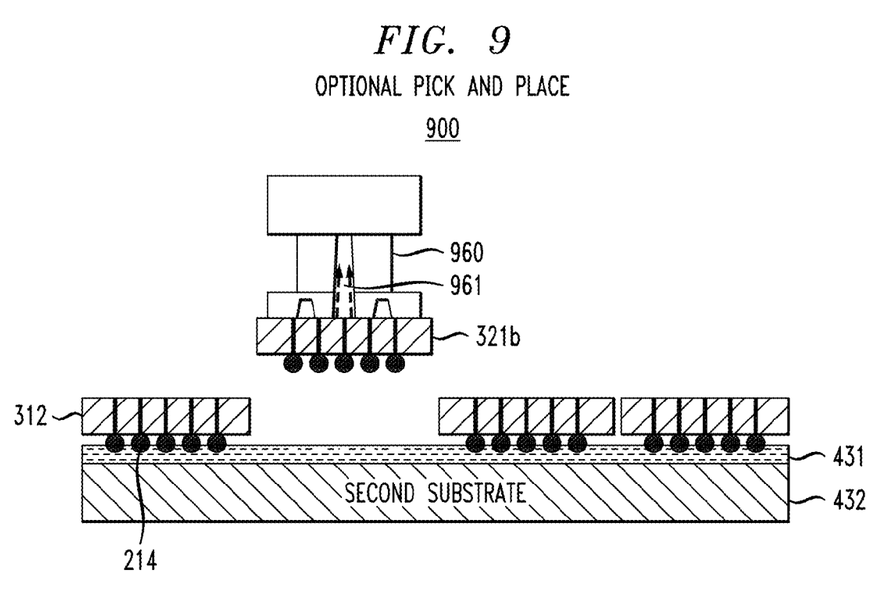
FIG. 9 illustrates pick and place using a vacuum tool to lift a die according to an exemplary embodiment of the invention.

The eighth step 170 is optional test, retest, replacement of or removal of die. Individual dies 321 may be tested for a first time if not tested before. Individual dies 321 may be retested, if tested before. Individual dies 321 may be replaced, for example, if testing showed a first individual die 321 to be defective, it may be replaced with a second individual die 321. Individual die 321 may be removed, for example, for placement elsewhere, or because the individual die 321 is defective. Movement of individual die 321, for example, for testing, replacement, placement elsewhere, or removal, is performed using a tool, for example, a vacuum tool. FIG. 8 shows the first structure 800 comprising the diced wafer 312 with solder bumps 214, including individual dies 321, laminated onto the second substrate 432 with flux 431, after optional test, retest, replace of, remove of die, or, if no options are performed, after ashing. FIG. 9 illustrates pick and place using the vacuum tool 960 to lift a third die 321b of the individual dies 321. The vacuum tool 960 comprises a vacuum line 961 for applying a vacuum to the third die 321b in order to hold, lift and move, or pick and place the third die 321b.

Figure 10A:
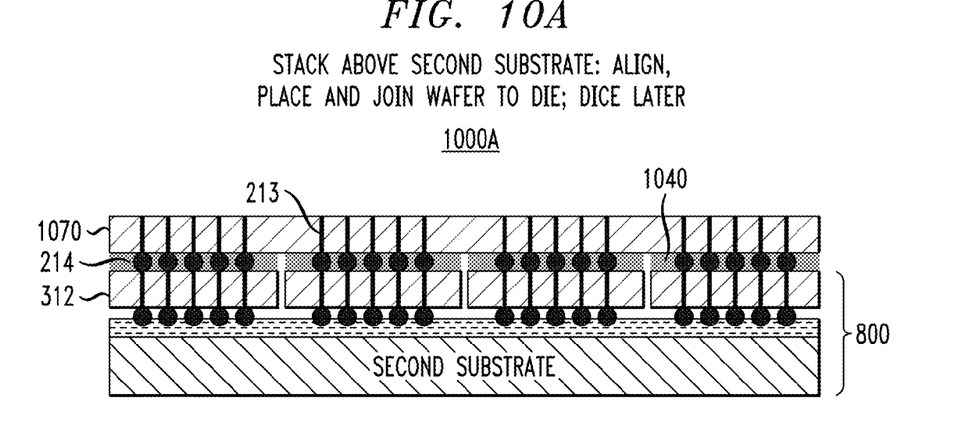
FIG. 10A illustrates forming die stacks by aligning, placing and joining a wafer to dies according to an exemplary embodiment of the invention. Wafer dicing is performed after forming the die stacks.
Figure 10B:
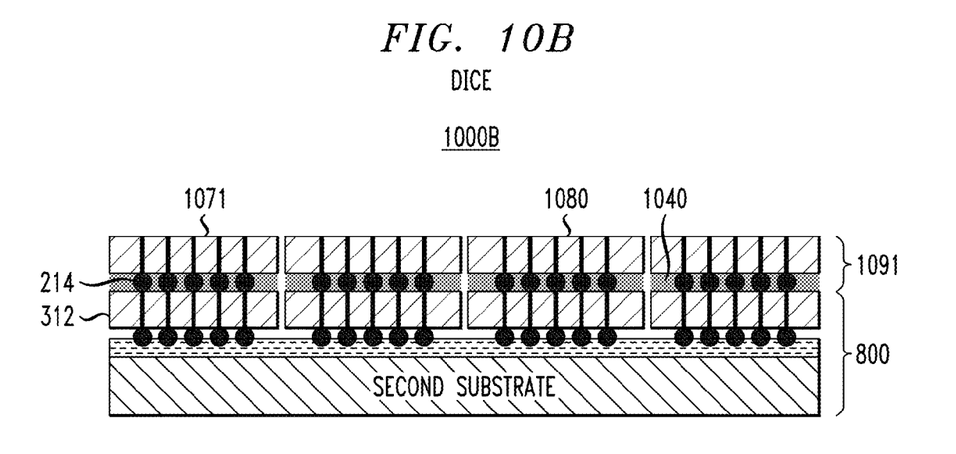
FIG. 10B shows the die stacks, illustrated in FIG. 10A, after wafer dicing according to an exemplary embodiment of the invention.
Figure 11:
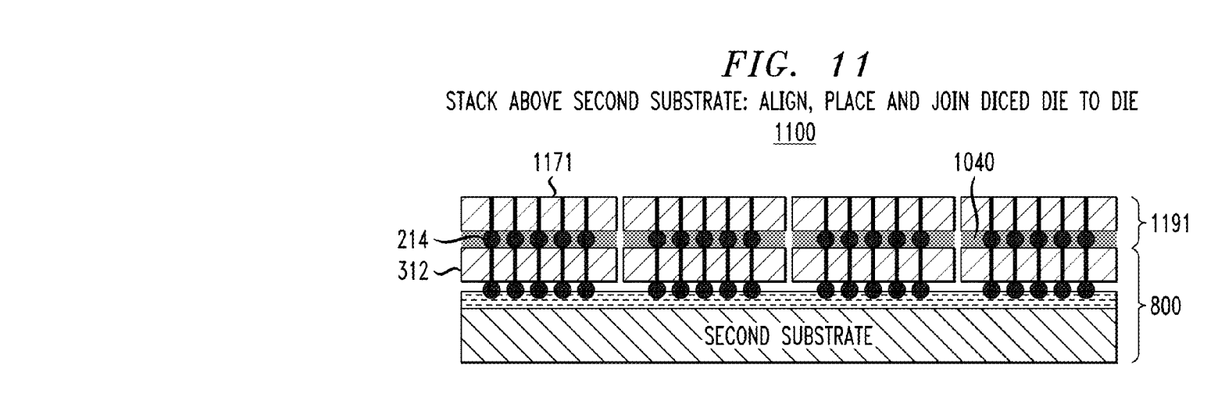
FIG. 11 illustrates forming die stacks by aligning, placing, and joining second individual dies to individual dies according to another exemplary embodiment of the invention.

In the ninth step 181, there are two options illustrated in FIG. 10A, FIG. 10B, and FIG. 11. The first option, illustrated in FIG. 10A and FIG. 10B, is to stack one or more additional wafers 1070 upon the first structure 800. A stack of one or more wafers is termed a wafer stack. Although FIG. 10A illustrates only one additional wafer 1070, more additional wafers 1070 may be stacked, in a similar manner, upon the additional wafer 1070 shown or other additional wafers 1070. The additional wafer 1070 is similar to the wafer 212. Therefore, the additional wafer 1070 is typically a semiconductor wafer, for example, a silicon wafer, and comprises metal conductors and, optionally, electrical circuits (not shown). The additional wafer 1070 may or may not have TSVs 213 going through the wafer. Typically, all but the uppermost additional wafer 1070 have TSVs 213. Because it is usually not necessary to make conduction through the uppermost additional wafer 1070, the uppermost additional wafer 1070 usually will not need to have TSVs 213. However, there are reasons that may make it advantageous to have TSVs 213 through the uppermost additional wafer 1070, for example, if dies within the uppermost additional wafer 1070 are similar to, or substantially identical to, other dies comprising TSVs 213, it may be economic to use the same die design, and therefore dies from substantially identical wafers, for the dies within the uppermost additional wafer 1070. The additional wafers 1070 are typically also thinned wafers. The additional wafers 1070 are thinned according to the method previously described. Solder bumps 214 are formed on the surface of additional wafers 1070 by methods previously described.

Stacking the one or more additional wafers 1070 comprises aligning, placing and joining the additional wafers 1070 to the individual dies 321 or other additional wafers 1070. The additional wafers 1070 are joined or adhered to individual die 321 or other additional wafers 1070 using additional flux 1040. The additional flux 1040 is similar to, but not necessarily the same as, flux 431. The same flux or a different flux may be used for flux 431 and additional flux 1040. The additional flux 1040 serves at least two purposes. The additional flux 1040 holds flat the diced additional wafer 1070 onto the individual dies 321. The additional flux 1040 also enhances bonding of the solder bumps, for example, to first and second pads. The additional flux 1040 is typically tacky, so that it will hold the additional wafer 1070 to the individual die 321. There are a number of fluxes available, for example, a no-clean flux, which will leave substantially no residue after the subsequent step of reflow 190. A second example of an available flux is a no-flow flux. An example of a no-flow flux is a no-flow underfill that serves as a flux in addition to serving as an underfill. An underfill at least partially fills voids after reflow 190. A third example of an available flux is a clean-required flux that typically requires cleaning of flux residue after reflow 190. Optionally dicing tape or a vacuum holder may be employed to hold the thinned additional wafer 1040, and subsequently first additional dies 1071 flat. However, flux is applied prior to reflow to enhance bonding of solder bumps.

After the one or more additional wafers 1070 are stacked, the additional wafers 1070 are diced according to methods previously described to form first additional dies 1071. FIG. 10B shows the second structure 1000B after dicing. The second structure 1000B comprises the first structure 800 and a third structure 1091. The third structure 1091 comprises first additional dies 1071, solder bumps 214, and additional flux 1040. The first additional dies 1071 may or may not have TSVs 213 going through the dies, depending upon the TSVs within the additional wafers 1070. The second structure 1000B comprises four die stacks 1080. Each die stack 1080 comprises at least two stacked dies with solder bumps 214, and flux. The stacked dies are, for example, dies 321 and/or first additional dies 1071. The flux is, for example, additional flux 1040. In general, a die stack comprises two or more dies stacked one upon another with couplings between the dies, for example the couplings comprising the solder bumps, 214.

A fourth structure 1100, similar to the third structure 1000B, is formed using the second option. The second option is to stack second additional dies 1171, with solder bumps 214, upon the first structure 800. The second additional dies 1171 are from wafers already diced according to methods previously described. The second additional dies 1171 may be dies 321 which are picked and placed, or they may be dies from other wafers. The second additional dies 1171 are joined or adhered to individual dies 321 or other second additional dies 1171 using the additional flux 1040. A fifth structure 1191 is formed by stacking a plurality of second additional dies 1171 upon a plurality of individual dies 321, with only one second additional die 1171 stacked above any individual die 321. The fifth structure 1191 comprises second additional dies 1171, with solder bumps 214, and additional flux 1040. The second additional dies 1171 may or may not have TSVs 213 going through the dies. Typically, all but the uppermost second additional dies 1171 have TSVs 213. Because it is usually not necessary to make conduction through the uppermost second additional dies 1171, the uppermost second additional dies 1171 usually will not need to have TSVs 213. However, there are reasons that may make it advantageous to have TSVs 213 through the second uppermost additional dies 1171, for example, if the second additional dies 1171 are similar to, or substantially identical to, other dies comprising TSVs 213, it may be economic to use the same die design for the second additional dies 1171. Optionally dicing tape or a vacuum holder may be employed to hold the thinned second additional dies 1171 flat. However, flux is applied prior to reflow to enhance bonding of solder bumps.

Although FIG. 11 shows only one second additional die 1171 stacked above any given individual die 321, there may be more than one second additional die 1171 stacked above any given individual die 321. Furthermore, an individual die 321 may have a different number of second additional dies 1171 stacked above it than another individual die does.

Figure 12:
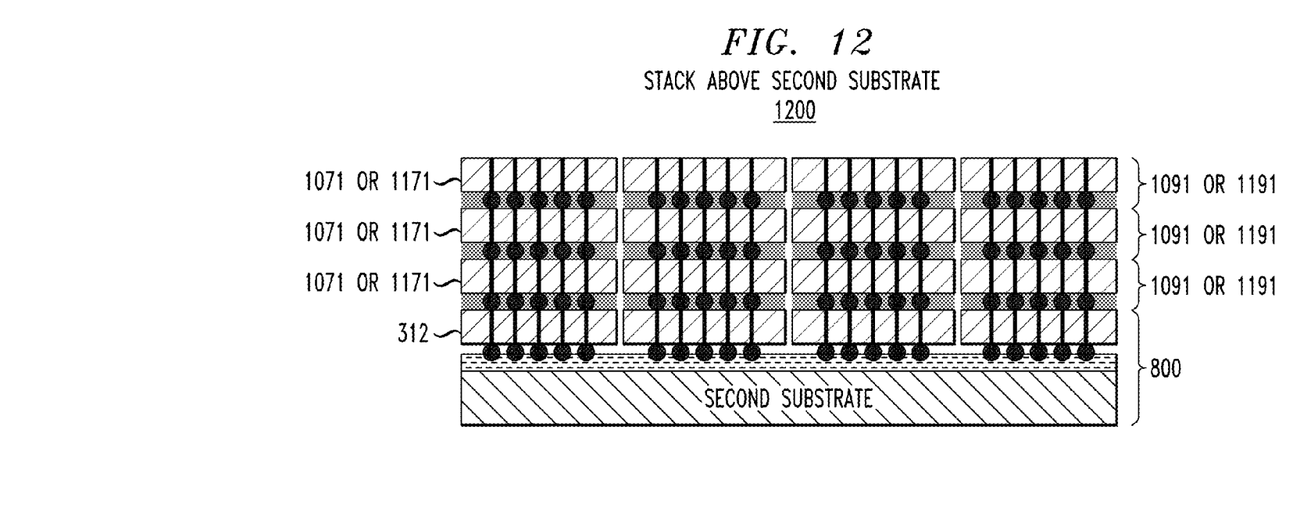
FIG. 12 illustrates die stacks comprising four dies each according to an exemplary embodiment of the invention.

FIG. 12 illustrates an embodiment 1200 having multiple first additional dies 1071 or second additional dies 1171 stacked above at least one individual die 321. The embodiment 1200 comprises the first structure 800 and a plurality of third structures 1091 and/or a plurality of fifth structures 1191.

Figure 13:
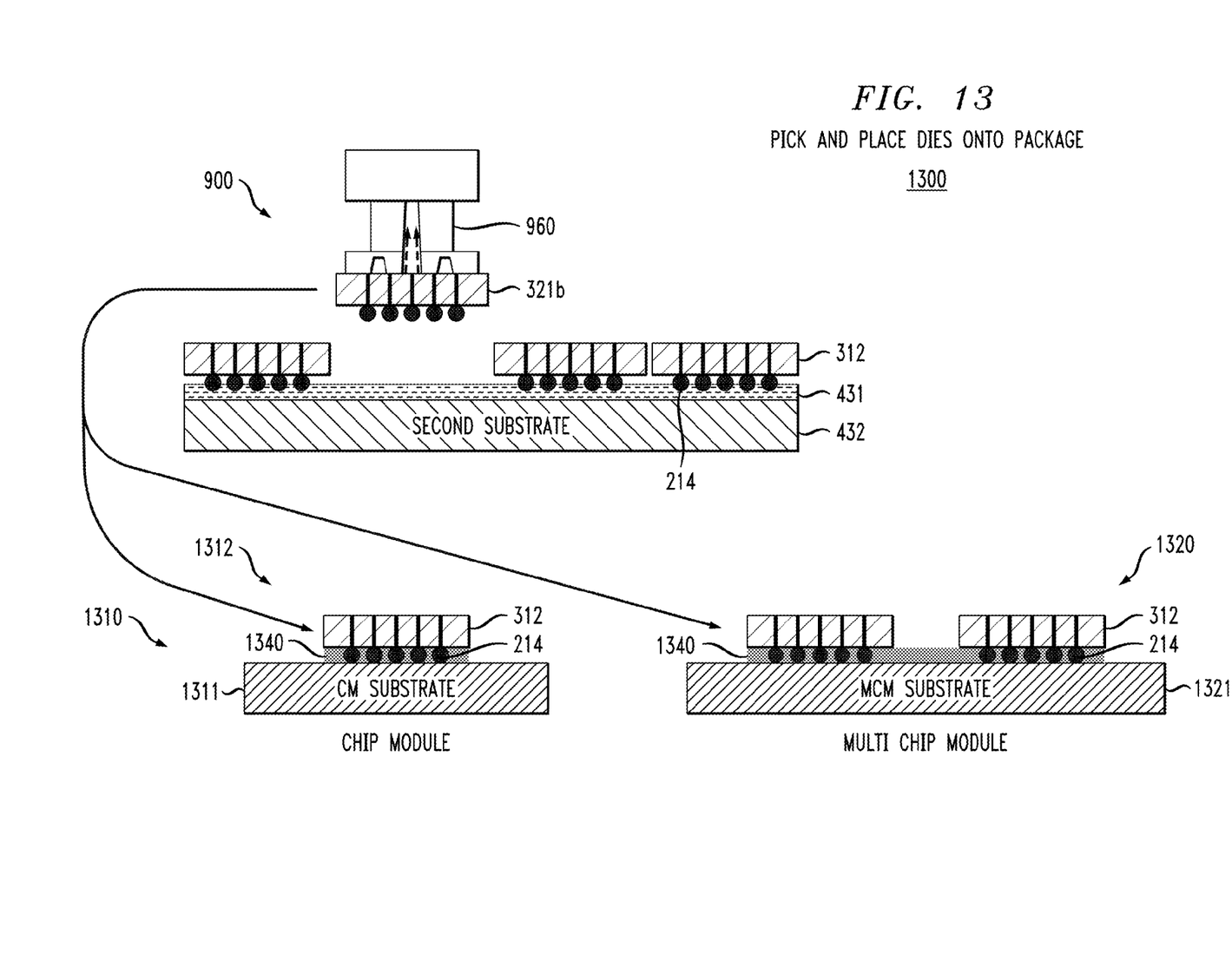
FIG. 13 illustrates pick and place for transferring individual dies onto a chip module substrate or a multiple chip module substrate according to an exemplary embodiment of the invention.

The tenth step 182 is an alternative to the ninth step 181. In the tenth step 182, individual dies 321 are placed upon a package substrate or within a package. FIG. 13 illustrates the pick and place method of FIG. 9 transferring individual dies 321 from the second substrate 432 onto a chip module (CM) substrate 1311 or a multiple chip module (MCM) substrate 1321 to form a CM 1310 or a MCM 1320, respectively. The CM substrate 1311 is, for example, similar to or substantially identical to a substrate used in a single chip module (SCM) package and commonly known as a SCM substrate. Without stacking dies, a SCM substrate would couple to only one die within a SCM package. Because, in embodiments of the invention, multiple dies can be stacked upon a CM substrate 1311, the CM 1310, or CM package, and CM substrate 1311 are not typically referred to as a MCM or a MCM substrate. The CM 1311, also known as a CM package, formed comprises the CM substrate 1311, at least one individual die 321 with solder bumps 214, and module flux 1340. The CM substrate 1311 comprises conductive metal third pads (not shown) on the upper surface to couple to the solder bumps 214. The CM substrate 1311, typically, further comprises wiring (not shown) and package pins (not shown) for external connections. The MCM 1320 formed comprises the MCM substrate 1321, a plurality of individual dies 321 with solder bumps 214, and module flux 1340. The MCM substrate 1321 comprises conductive metal third pads (not shown) on the upper surface to couple to the solder bumps 214. The MCM substrate 1321, typically, further comprises wiring (not shown) and package pins (not shown) for external connections. The module flux 1340 is similar to, but not necessarily the same as, additional flux 1041. The same flux or a different flux may be used for additional flux 1040 and module flux 1340. The module flux 1340 serves at least two purposes. The module flux 1340 holds flat at least one individual die 321 onto the CM substrate 1311 or the MCM substrate 1321. The module flux 1340 also enhances bonding of the solder bumps 214 to, for example, the first pads, and the third pads. The module flux 1340 is typically tacky, so that it will hold the individual dies 321 to CM substrate 1311 or the MCM substrate 1321. There are a number of fluxes available, for example, a no-clean flux, which will leave substantially no residue after the subsequent step of reflow 190. A second example of an available flux is a no-flow flux. The no-flow flux additionally acts as an underfill, at least partially filling voids after reflow 190. A third example of an available flux is a clean-required flux that typically requires cleaning of flux residue after reflow 190.

A MCM comprises a plurality of individual dies 321 directly attached to the MCM substrate 1321 through solder bumps 214. Typically, two or more of the individual dies 321 are positioned in substantially the same plane (coplanar), one next to another. Coplanar individual dies 321 are positioned, for example, in a line, in a matrix, or in some other pattern within the plane. In contrast, a CM substrate 1311 has only one individual die 312 directly attached to the surface of the CM substrate 1311. For both the CM 1310 and MCM 1320, other individual dies 312 may be attached to individual dies 312 forming die stacks.

Figure 14:
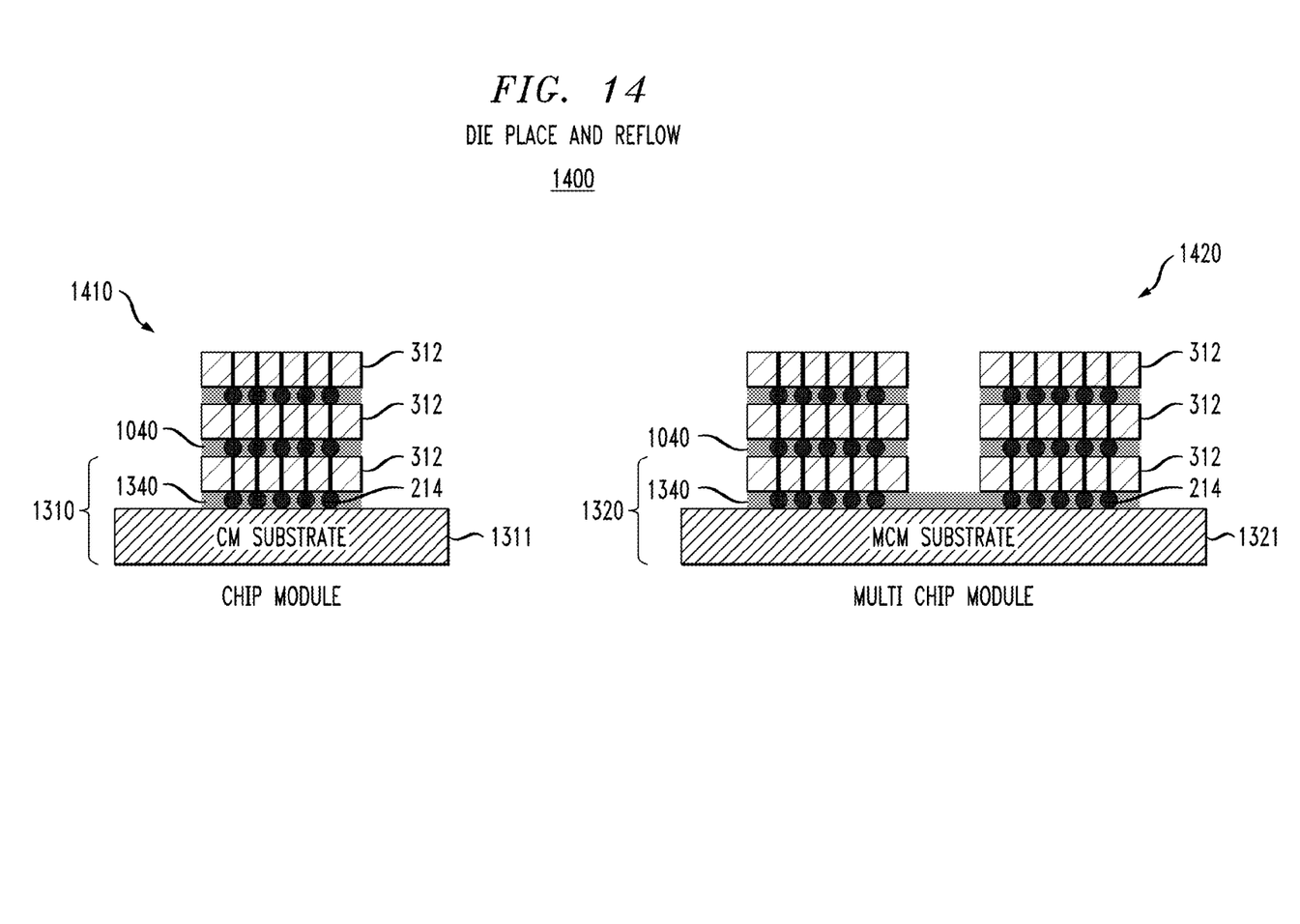
FIG. 14 illustrates a multi-level chip module and a multi-level multi chip module with individual dies stacked to a height of three according to an exemplary embodiment of the invention.

FIG. 14 shows a multi-level CM 1410 and a multi-level MCM 1420 with individual dies 321 stacked to a height of more than one, for example, stacked to a height of three. The individual dies 321 are coupled to solder bumps 214. The individual dies 321, above the first individual dies 321, are coupled to the individual die below by additional flux 1040 as previously described.

The eleventh step 190 is reflow. Reflow comprises bonding of the solder bumps 214 to first pads and to at least one of second pads and third pads. Reflow is performed, for example, after the ninth step 181 or the tenth step 182. Reflow is performed by apply heat to a first unit. The first unit comprises solder bumps 214, and at least one individual die 321 attached to another individual die 321, additional die 1071, additional die 1171, or a substrate, for example, the second substrate 432, the CM substrate 1311, or the MCM substrate 1321. The first unit is, for example, the second structure 1000B, the fourth structure 1100, the embodiment 1200, the CM 1310, the MCM 1320, multi-level CM 1410, or multi-level MCM 1420. Heat is applied so that at least the melting temperature of the solder bumps is reached. Bonding occurs. The bonding mechanically and electrically couples first pads to second pad, and/or first pads to third pads.

Solder bumps comprise solder. Solders of various compositions, and with various melting temperatures, are available. For example, solder is available with the eutectic mixture of approximately 37% lead and 63% tin having a melting temperature of approximately 183 degrees C. Typically a first unit comprising solder, having the eutectic mixture of tin and lead, is heated to between 193 degrees C. and 220 degrees C. Another example of available solder is silver-copper solder. Lead free solder typically comprises approximately 95% tin with other metals, such as silver, copper, zinc, antimony, bismuth and indium, making up the remaining 5%. The melting point of lead free solder depends on the exact composition but approximately in the range of 217-231 degrees C. Lead free solder is also available with less than 95% tin and may have a have a melting point below or above the 217-231 degree C. range, for example up to 260 degrees C. and as low as 118 degrees C. (48% tin and 52% indium). High melt solder is available that melts at a high temperature. For example, 97% lead, 3% tin is a high melt solder that melts at approximately 350 degrees C.

Because various solders melt at various temperatures, an embodiment of the invention has more than one eleventh step 190, that is, more than one reflow step. An example embodiment comprises a second unit that comprises the first unit described above. The first unit is formed and undergoes a first reflow at a first temperature. The second unit is subsequently formed. The second unit comprises the first unit and at least one additional coupling. The at least one additional coupling comprises solder. For example, the first unit may be formed and undergoes the first reflow. Subsequently, the first unit is optionally tested. After testing the first unit, more individual dies are added to the first unit to form the second unit. The second unit then undergoes a second reflow at a second temperature. For another example, after the first unit is formed undergoes the first reflow, it is mounted on a third substrate, for example, a printed circuit board, to form the second unit. The second unit then undergoes the second reflow at the second temperature. For an additional example, the first unit and a third unit are individually formed and undergo the first and a third reflow, respectively, at the first and a third temperature, respectively. The second unit is then formed comprising both the first and third units. The second unit then undergoes reflow at a second temperature. Typically the first and third temperatures are higher than the second temperature so that the solder within the first and third units will not melt during the second reflow.

During the eleventh step 190, that is, reflow, pressure is optionally applied to a die stack to maintain planarity and/or help form the bonds between the solder bumps 214 and the first, second and/or third pads. The pressure is applied by, for example, weight added to the die stack.

The twelfth step 195 is a clean. The twelfth step 195 is optional. A clean is optionally performed to remove residue which may remain form the flux 431, the additional flux 1040, or the module flux 1340. The twelfth step is preformed if the clean-required flux is used for the flux 431, the additional flux 1040, or the module flux 1340. The twelfth step is not necessary if the no-clean flux or the no-flow flux is used for the flux 431, the additional flux 1040, or the module flux 1340.

Because aspects of the invention are low height solder bumps and closely spaced solder bumps, cleaning may be difficult or inadequate using some of the known methods to perform the clean. A preferred method to perform the clean is vapor cleaning, wherein vapor is applied to the area to be cleaned. The vapor reacts with the residue to be cleaned. Vapor cleaning is preferred because the vapors can more easily enter the cavities are volumes to be cleaned than liquid or solids cleaning agents can. Heat may be applied during the clean. For example, heat is applied during the vapor clean, to form the vapor, to enhance chemical action or to enhance vapor flow.

If a flux other than the no-flow flux is used for any of the flux 431, the additional flux 1040, or the module flux 1340, underfill is optionally applied to, at least partially, fill the voids between any of the individual dies 321, the first additional dies 1071, the second additional dies 1171, the second substrate 432, the CM substrate 1311, the MCM substrate 1321, any printed circuit board, and any other substrate. The underfill also adds support between the above mentioned dies and substrates.

An embodiment of the invention is an integrated circuit assembly comprising a first integrated circuit die. The integrated circuit assembly is formed by forming solder bumps on the first integrated circuit die and forming a structure comprising the first integrated circuit die, the solder bumps, a substratum, and flux, dicing tape or a vacuum chuck. The first integrated circuit die is placed upon the substratum. The solder bumps are between the first integrated circuit die and the substratum. The flux, dicing tape or vacuum chuck holds the first integrated circuit die substantially flat and onto the substratum. In one embodiment, the first integrated circuit die comprises the processor.

In another embodiment, the first integrated circuit die comprises at least a portion of the memory. In yet another embodiment, the first integrated circuit die comprises at least one of a first processor and a first memory. A second integrated circuit die comprises at least one of a second processor and a second memory. The processor comprises at least one of the first and the second processors. The memory comprises at least one of the first and the second memories.

It is to be appreciated that the term "processor" as used herein is intended to include any processing device, such as, for example, one that includes a central processing unit (CPU) and/or other processing circuitry. It is also to be understood that the term "processor" may refer to more than one processing device, for example, the first processor and the second processor, and that various elements associated with a processing device may be shared by other processing devices.

It is to be appreciated that the integrated circuit assemblies of the invention, described herein and shown in the appended figures, may be used within various forms of hardware, e.g., one or more digital computers with associated memory, implementation-specific integrated circuit(s), functional circuitry, etc. Given the techniques of the invention provided herein, one of ordinary skill in the art will be able to contemplate other implementations of the techniques of the invention.

Although illustrative embodiments of the invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A method for forming an integrated circuit assembly, the method comprising the steps of:
   forming a first die on a first substrate;
   forming first solder bumps on the first die;
   forming a first structure comprising the first substrate, the first die, the first solder bumps, a first flux and a first substratum, wherein the first die is placed upon the first substratum, wherein the first solder bumps are between the first die and the first substratum, and wherein the first flux holds the first die substantially flat and onto the first substratum;
   separating the first substrate from the first die after forming the first structure;
   forming second solder bumps on a second die; and
   forming a second structure comprising the second die, the second solder bumps, a second flux, and a second substratum, wherein the second die is placed upon the second substratum, wherein the second solder bumps are between the second die and the second substratum, and wherein the first substratum comprises the second die.

2. The method of claim 1
   wherein the second flux holds the second die substantially flat and onto the second substratum.

3. The method of claim 1 further comprising the step of:
   dicing a first wafer comprising the first die and the second die, wherein the first wafer is diced to separate the first die from the second die, and wherein the first wafer is mounted on the first substrate while undergoing the step of the dicing of the first wafer.

4. The method of claim 3, wherein a third structure comprises the first and second structures, a third flux, and a second wafer having attached wafer solder bumps, wherein the second wafer is placed upon the first and second structures, wherein the wafer solder bumps are between the second wafer and the first and second structures, and wherein the third flux holds the second wafer substantially flat and onto the first and second structures.

5. The method of claim 1, wherein the first die and second die are thinned dies, and wherein at least one of the first die and the second die comprises through silicon vias.

6. The method of claim 1, wherein the first substratum comprises at least one of first glass, first silicon, and a first boat, and is adapted to supporting the first die after the first substrate has been removed, and wherein the second substratum comprises at least one of second glass, second silicon, and a second boat, and is adapted to supporting the second die after a second substrate has been removed.

7. The method of claim 1, wherein:
   the first structure and the second structure form a die stack.

8. The method of claim 7 further comprising the step of:
   forming additional solder bumps on at least one additional die; and
   forming at least one additional structure, the at least one additional structure comprising an additional die, additional solder bumps, and additional flux, wherein the additional flux holds the additional die substantially flat and onto at least one additional substratum, wherein the at least one additional substratum comprises the first die, wherein the die stack further comprises the at least one additional structure.

9. The method of claim 1 further comprising the step of: testing at least one of the first die, the second die, the first structure and the second structure.

10. The method of claim 1, wherein at least one of the first and second solder bumps is less than approximately 12 μm high.

11. The method of claim 1, wherein at least two of the first and second solder bumps are spaced with a center-to-center spacing less than approximately 50 μm.

12. The method of claim 1, wherein the first die is thinner than approximately 100 μm.

13. The method of claim 1, wherein the first solder bumps comprise at least one of tin-lead solder, silver-copper solder, lead free solder, high melt solder, and solder comprising at least one of tin, lead, silver, copper, zinc, antimony, bismuth and indium, and wherein the melting temperature of the first and second solder bumps is between approximately 118 degrees Celsius and approximately 312 degrees Celsius.

14. The method of claim 1, wherein the first die comprises at least one of a memory circuit, a processor, an application specific integrated circuit, a field programmable gate array, a digital circuit, a logic circuit, an analog circuit, and an electronic circuit comprising a transistor.

15. The method of claim 1, wherein first flux is further adapted to assist in forming bonds comprising the first solder bumps.

16. A method for forming an integrated circuit assembly, the method comprising the steps of:
  forming first solder bumps on a first die;
  forming a first structure comprising the first die, the first solder bumps, a first flux and a first substratum, wherein the first die is placed upon the first substratum, wherein the first solder bumps are between the first die and the first substratum, and wherein the first flux holds the first die substantially flat and onto the first substratum;
  forming second solder bumps on a second die;
  forming a second structure comprising the second die, the second solder bumps, a second flux, and a second substratum, wherein the second die is placed upon the second substratum, wherein the second solder bumps are between the second die and the second substratum, and wherein the second flux holds the second die substantially flat and onto the second substratum;
  dicing a first wafer comprising the first die and the second die, wherein the first wafer is diced to separate the first die from the second die, and wherein the first wafer is mounted on a dicing substrate while undergoing the step of the dicing of the first wafer;
  laminating the first die onto the first substratum;
  releasing the first die from the dicing substrate and the second die from the dicing substrate using energy from a laser;
  removing the dicing substrate from the first die and the dicing substrate from the second die;
  removing residue of bonding material from the first die and the second die; and
  forming bonds by heating the first and second solder bumps to at least a melting temperature of the first and second solder bumps.

17. The method of claim 16 further comprising the step of: cleaning the first die, the second die and the bonds after completing the step of the forming of the bonds.

18. A method for forming an integrated circuit assembly, the method comprising the steps of:
  forming a first die on a first substrate;
  forming first solder bumps on the first die;
  forming a first structure comprising the first substrate, the first die, the first solder bumps, a first flux and a first substratum, wherein the first die is placed upon the first substratum, wherein the first solder bumps are between the first die and the first substratum, and wherein the first flux holds the first die substantially flat and onto the first substratum;
  separating the first substrate from the first die after forming the first structure;
  forming second solder bumps on a second die; and
  forming a second structure comprising the second die, the second solder bumps, a second flux, and a second substratum, wherein the second die is placed upon the second substratum, wherein the second solder bumps are between the second die and the second substratum, and wherein the second flux holds the second die substantially flat and onto the second substratum.

19. The method of claim 18, wherein the first substratum comprises a package substrate, and wherein the package substrate is at least one of a chip module substrate, and a multi-chip module substrate.

20. The method of claim 18, wherein a tool is used to remove the first die from the first substratum, and place the first die onto at least one of the second die and a package substrate.

* * * * *